United States Patent
Choi et al.

(10) Patent No.: US 7,812,525 B2
(45) Date of Patent: Oct. 12, 2010

(54) RETARDATION LAYER AND ORGANIC LIGHT-EMITTING DEVICE INCLUDING THE SAME

(75) Inventors: Jin-Baek Choi, Suwon-si (KR); Won-Jong Kim, Suwon-si (KR); Yong-Tak Kim, Suwon-si (KR); Jong-Hyuk Lee, Suwon-si (KR); Young-Woo Song, Suwon-si (KR); Yoon-Hyeung Cho, Suwon-si (KR); Byoung-Duk Lee, Suwon-si (KR); Sun-Young Lee, Suwon-si (KR); Min-Ho Oh, Suwon-si (KR); So-Young Lee, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 418 days.

(21) Appl. No.: 11/757,293

(22) Filed: Jun. 1, 2007

(65) Prior Publication Data
US 2008/0157655 A1    Jul. 3, 2008

(30) Foreign Application Priority Data
Dec. 28, 2006    (KR) ............... 10-2006-0136887

(51) Int. Cl.
*H01J 1/62* (2006.01)
*H05B 33/22* (2006.01)
(52) U.S. Cl. .................. 313/506; 313/512; 313/112
(58) Field of Classification Search ......... 313/498–512, 313/112
See application file for complete search history.

(56) References Cited

FOREIGN PATENT DOCUMENTS

| JP | 11-295525 | 10/1999 |
|---|---|---|
| KR | 1994-0021628 | 10/1994 |
| KR | 2002-0015016 | 2/2002 |
| KR | 10-2004-0034374 | 4/2004 |
| KR | 10-2006-0064680 | 6/2006 |

OTHER PUBLICATIONS

Patent abstracts of Japan for publication No. 11-295525 dated Oct. 29, 1999 in the name of Akiko Shimizu et al.
Korean patent abstracts for publication No. 1020040034374 A dated Apr. 28, 2004 in the name of Byeong Gwon Ju, et al.
Korean patent abstract dated Oct. 19, 1994 for publication No. 10-1994-0021628.
Korean patent abstract dated Feb. 27, 2002 for publication No. 1020020015016 A in the name of Judy Megan Rorison, et al.
Korean patent abstract dated Jun. 13, 2006 for publication No. 1020060064680A in the name of Pavel I. Lazarev.

*Primary Examiner*—Joseph L Williams
(74) *Attorney, Agent, or Firm*—Christie, Parker & Hale, LLP

(57) ABSTRACT

A wideband retardation layer (or film) that can perform circular polarizing so that the retardation layer can be formed with an organic light-emitting device to be relatively thin and have a relatively high contrast with no reduction in brightness, and an organic light-emitting device including the retardation layer. The retardation film includes a base and a retardation layer including an alkali oxide layer grown to be inclined on a surface of the base, wherein the alkali oxide layer is disposed by slant-angle depositing alkali oxide on the surface of the base.

13 Claims, 12 Drawing Sheets

EXTERNAL LIGHT

EXTERNAL LIGHT

RETARDATION LAYER AND ORGANIC LIGHT-EMITTING DEVICE INCLUDING THE SAME

CROSS-REFERENCE TO RELATED PATENT APPLICATION

This application claims priority to and the benefit of Korean Patent Application No. 10-2006-0136887, filed on Dec. 28, 2006, in the Korean Intellectual Property Office, the entire content of which is incorporated herein by reference.

BACKGROUND OF THE INVENTION

1. Field of the Invention

The present invention relates to a retardation layer (or film) and an organic light-emitting device including the retardation layer.

2. Description of the Related Art

Organic light-emitting devices are self-emissive devices (i.e., they do not need to use a backlight unit). The organic light-emitting devices have relatively higher brightness than liquid crystal displays and can be formed to be relatively thin because no backlight unit is used.

However, organic light-emitting devices have relatively low contrast due to light reflected therefrom when images are viewed in bright environments (e.g., in sunlight).

One way of improving contrast in organic light-emitting devices is to use a circular polarizer.

A circular polarizer used in conventional organic light-emitting devices is in the form of a film, and is formed by attaching a linear polarization film and a quarter (¼) wavelength layer to an image display surface using an adhesive. However, it is difficult to form such a film-type circular polarizer to be thin because it includes films and an adhesive layer. Moreover, images must be transmitted through all films constituting a circular polarizer, even through an adhesive layer, thereby decreasing light extraction efficiency, resulting in a reduction in brightness.

SUMMARY OF THE INVENTION

An aspect of an embodiment of the present invention is directed to a retardation layer (or film) for performing circular polarizing and an organic light-emitting device including the retardation layer.

An aspect of an embodiment of the present invention is directed to a retardation layer (or film) adapted to perform circular polarizing so that it can be formed with an organic light-emitting device to be relatively thin and to have a relatively high contrast with no relative reduction in brightness, and an organic light-emitting device including the retardation layer.

According to an embodiment of the present invention, there is provided a retardation film including a base; and a retardation layer including an alkali oxide layer grown up to be inclined on a surface of the base, wherein the alkali oxide layer is slant-angle deposited on the surface of the base.

In one embodiment, the alkali oxide includes CaO, BaO, or combinations thereof.

In one embodiment, the retardation layer includes a quarter (¼) wavelength layer, a half (½) wavelength layer, or combinations thereof.

According to another embodiment of the present invention, there is provided an organic light-emitting device including a substrate; an organic light-emitting element disposed on the substrate and for displaying an image; a sealing member disposed on the organic light-emitting element; a retardation layer disposed on a first surface of the substrate, the organic light-emitting element, or the sealing member, and including an alkali oxide layer grown up to be inclined on the first surface; and a linear polarization layer disposed on a second surface of the substrate, the organic light-emitting element, the sealing member, or the retardation layer, and being disposed closer to an image display surface of the organic light-emitting device than the retardation layer.

In one embodiment, the linear polarization layer is disposed on the substrate, the retardation layer is disposed on the linear polarization layer, and the organic light-emitting element is disposed on the retardation layer.

In one embodiment, the retardation layer is disposed on the substrate, the organic light-emitting element is disposed on the retardation layer, and the linear polarization layer is disposed on the substrate opposite to a surface of the substrate facing the retardation layer.

In one embodiment, the retardation layer and the linear polarization layer are sequentially disposed on the substrate opposite to a surface of the substrate facing the organic light-emitting element.

In one embodiment, the retardation layer is disposed on the organic light-emitting element, and the linear polarization layer is disposed on the retardation layer.

In one embodiment, the organic light-emitting device further includes a protective layer disposed on the organic light-emitting element. Here, the retardation layer is disposed on the protective layer, and the linear polarization layer is disposed on the retardation layer.

In one embodiment, the organic light-emitting device further includes a protective layer disposed on the organic light-emitting element. Here, the retardation layer is disposed between the organic light-emitting element and the protective layer, and the linear polarization layer is disposed on the protective layer.

In one embodiment, the organic light-emitting device further includes a reflective layer interposed between the substrate and the organic light emitting layer. Here, the retardation layer is disposed between the reflective layer and the organic light-emitting element, and the linear polarization layer is disposed on the organic light-emitting element.

In one embodiment, the sealing member is a transparent substrate, and the retardation layer and the linear polarization layer are sequentially disposed on the sealing member opposite to a surface of the sealing member facing the organic light-emitting element.

In one embodiment, the sealing member is a transparent substrate, and the retardation layer is disposed on the first surface of the sealing member facing the organic light-emitting element, and the linear polarization layer is disposed on the second surface of the sealing member opposite to the first surface of the sealing member facing the retardation layer.

In one embodiment, the sealing member is a transparent substrate, wherein the linear polarization layer is disposed on the second surface of the sealing member facing the organic light-emitting element, and the retardation layer is disposed on the first surface of the linear polarization layer facing the organic light-emitting element.

In one embodiment, the alkali oxide includes CaO, BaO, or combinations thereof.

In one embodiment, the retardation layer includes a quarter (¼) wavelength layer, a half (½) wavelength layer, or combinations thereof.

According to another embodiment of the present invention, there is provided a method of forming a retardation layer, the method including slant-angle depositing alkali oxide on a surface of a base to form an alkali oxide layer; and growing the oxide layer to be inclined on the surface of the base to form the retardation layer on the surface of the base.

In one embodiment, the slant-angle depositing of the alkali oxide includes slant-angle depositing CaO, BaO, or combinations thereof on the surface of the base to form the alkali oxide layer.

In one embodiment, the retardation layer is formed to have a quarter (¼) wavelength layer, a half (½) wavelength layer, or combinations thereof.

In one embodiment, the slant-angle depositing of the alkali oxide includes slant-angle depositing CaO, BaO, or combinations thereof on the surface of the base to form the alkali oxide layer, and wherein the retardation layer is formed to have a quarter (¼) wavelength layer, a half (½) wavelength layer, or combinations thereof.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
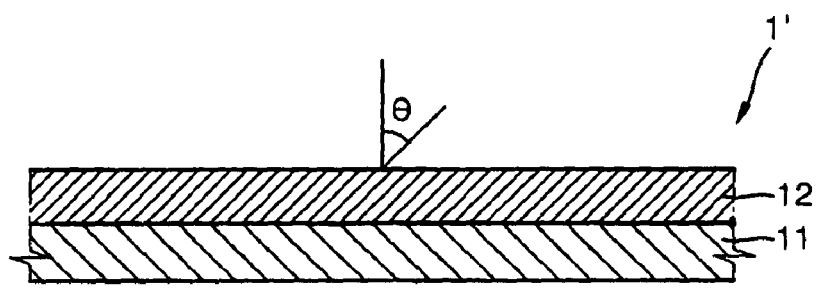
FIG. 1 is a schematic view illustrating a wideband retardation film according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, in the context of the present application, an organic light-emitting device is referred to as a self-emissive display device that includes one or more organic light-emitting diodes (OLEDs) and associated driving devices (e.g., one or more thin film transistors (TFTs)). Hereinafter, like reference numerals refer to like elements.

FIG. 1 is a schematic view illustrating a wideband retardation film 1 according to an embodiment of the present invention.

Referring to FIG. 1, the wideband retardation film 1' includes a retardation layer 12 slant-angle deposited on a base 11.

The retardation layer 12 should have the property of double refraction to function as a retardation layer.

Accordingly, the material of the retardation layer 12 may inherently have the property of double refraction, or, alternatively, may be artificially formed (e.g., with another material or additional process) to obtain the property of double refraction.

According to the current embodiment of the present invention, the retardation layer 12 is artificially formed to obtain the property of double refraction using a method in which alkali oxide having a high polarisibility is slant-angle deposited on a surface of the base 11 to form alkali oxide layer. Here, the alkali oxide layer may be CaO and/or BaO.

As shown, an angle of depositing is $\theta$ with respect to a direction perpendicular to the surface of the base 11 in FIG. 1. The alkali oxide may be deposited so that $\theta$ may be in the range from 50 to 80 degrees. In one embodiment, the minimum value of $\theta$ in which alkali oxide is slant-angle deposited to be formed as a thin film is about 50 degrees. In one embodiment, when the $\theta$ is in the range from 50 to 80 degrees, satisfactory phase retardation effect can be achieved. In one embodiment, when the $\theta$ is 50 degrees or less, a thin film may be not formed to be slightly inclined. In addition, in order to achieve phase retardation effect, the $\theta$ should be about 80 degrees or less. In one embodiment, when the $\theta$ is greater than 80 degrees, phase retardation effect may be slight.

Figure 2:
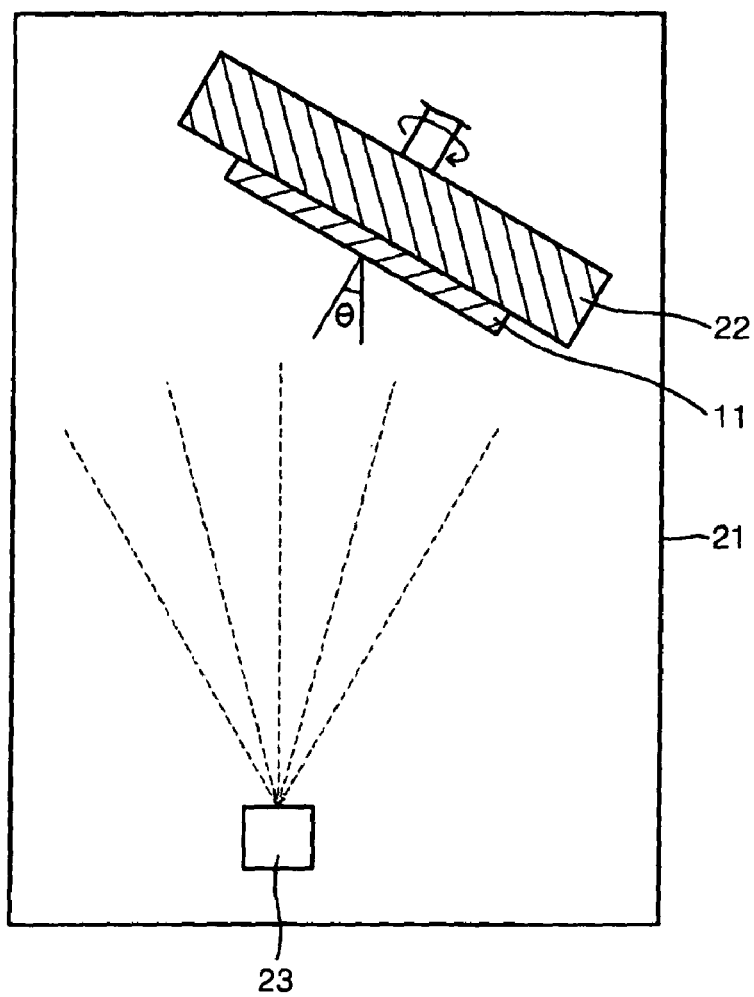
FIG. 2 is a view illustrating a slant-angle deposition according to an embodiment of the present invention.

FIG. 2 is a view illustrating a slant-angle deposition according to an embodiment of the present invention. Referring to FIG. 2, a support 22 is disposed in a chamber 21 to be slightly inclined, and a deposit source 23 is disposed in a lower part of the chamber 21 so as to deposit materials. Here, the base 11 is supported by the support 22. An angle between a direction perpendicular to a surface of the support 22 and a direction towards the deposit source 23 is $\theta$.

The retardation layer 12, which is slant-angle deposited using the above operation and is made of CaO and/or BaO. The retardation layer 12 may be a quarter (¼) wavelength layer or a half (½) wavelength layer according to the thickness of the retardation layer 12. In addition, the retardation layer may be stacked with one or more ¼ wavelength layers and/or ½ wavelength layers.

When the retardation layer 12 is made of a CaO layer to have a thickness in the range from 2 to 5 μm, the retardation layer 12 is used as a ¼ wavelength layer. When the retardation layer 12 is made of the CaO layer to have a thickness in the range from 4 to 10 μm, the retardation layer 12 is used as a ½ wavelength layer. When the retardation layer 12 is formed to be a ¼ wavelength layer, since the retardation layer 12 circular polarizes linearly polarized visible rays, the retardation layer 12 may form a circular polarizing layer with a linear polarization layer. In addition, when a ¼ wavelength layer and a ½ wavelength layer are used together, it can be set whether light is right circular polarized or left circular polarized, and a circular polarized angle can be also set.

When the retardation layer 12 made of the CaO layer and/or a BaO layer is used in an organic light-emitting device, the retardation layer 12 concurrently functions as a moisture absorbing layer due to the property of moisture absorption.

When alkali oxide is slant-angle deposited on the surface of the base 11, the retardation layer 12 includes a plurality of fine pillar-shaped columns inclined on the surface of the base 11.

Figure 3:
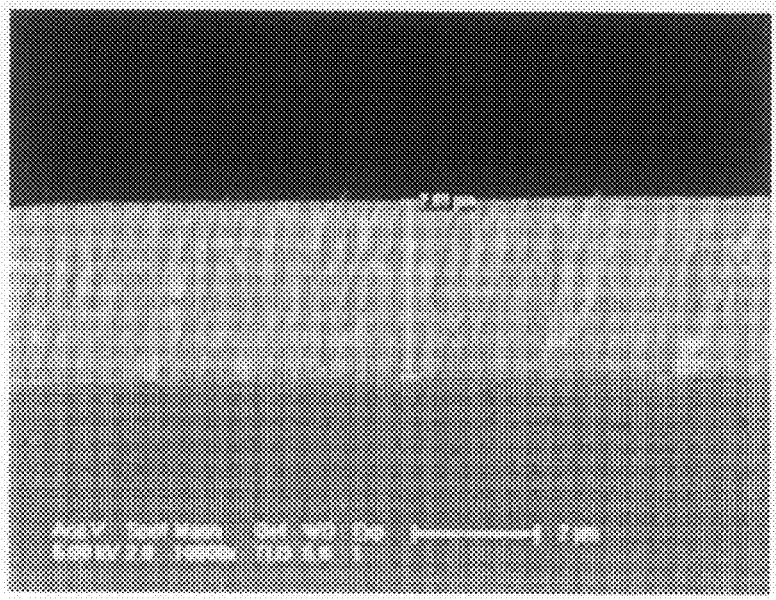
FIG. 3 is an image of a sectional shape of a retardation layer according to an embodiment of the present invention.

FIG. 3 is an image of a sectional shape of a retardation layer formed using a method in which CaO is slant-angle deposited to have a thickness of 2.41 μm according to an embodiment of the present invention. Referring to FIG. 3, it can be seen that crystals of CaO are pillar-shaped columns arranged to be inclined.

As such, a retardation layer according to an embodiment of the present invention can be used as a circular polarizing layer of an organic light-emitting device in addition to a linear polarization layer as described in more detail below.

Figure 4:
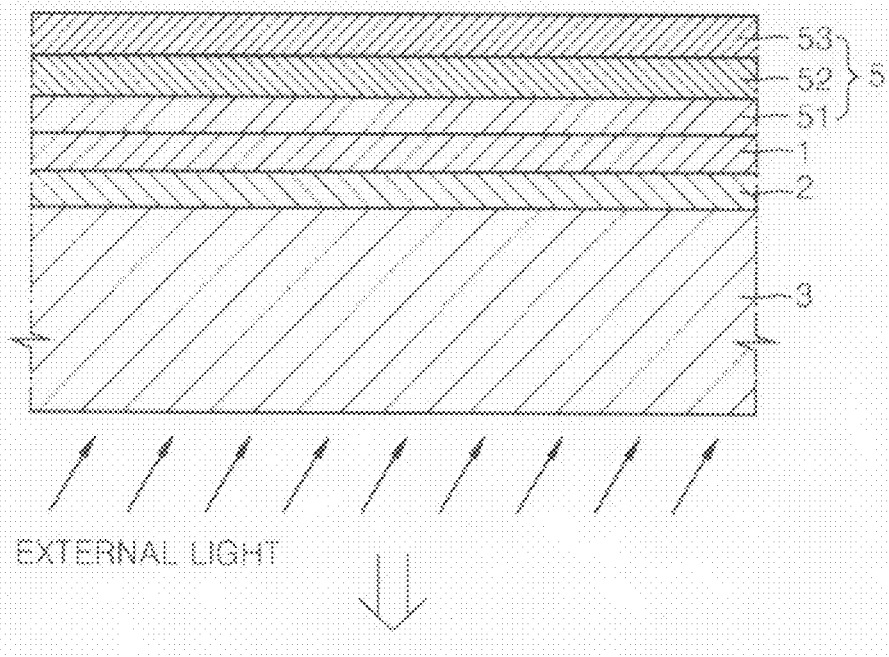
FIG. 4 is a schematic cross-sectional view illustrating a bottom emission type organic light-emitting device according to an embodiment of the present invention.

FIG. 4 is a schematic cross-sectional view illustrating a bottom emission type organic light-emitting device according to an embodiment of the present invention.

Referring to FIG. 4, the organic light-emitting device according to the current embodiment of the present invention includes a substrate 3 made of a transparent material, a linear polarization layer 2, a retardation layer 1, and an organic light-emitting element 5. The linear polarization layer 2, the retardation layer 1, and the organic light-emitting element 5 are sequentially formed on the substrate 3. In addition, a sealing member (e.g., glass, a thin film member or a metal cap) for sealing the organic light-emitting element 5 may be further disposed on the organic light-emitting element 5.

The substrate 3 may be made of transparent glass made of mainly $SiO_2$, but is not limited thereto. In addition, a buffer layer may be further formed on the substrate 3 in order to smooth (or smooth out) the substrate 3 (or make the substrate 3 more smooth) and to protect the substrate 3 from impurities, and may be made of $SiO_2$, SiNx, and/or the like. The substrate 3 may also be made of a transparent plastic material.

The linear polarization layer 2 is formed on the substrate 3, and the retardation layer 1 is formed on the linear polarization layer 2. The organic light-emitting element 5 is formed on the retardation layer 1. The linear polarization layer 2 and the retardation layer 1 are stacked in such a way that the linear polarization layer 2 is disposed to have a surface facing an incidence side of external light, and the retardation layer 1 is disposed on an opposite surface of the linear polarization layer 2 to the incident side of external light. Any suitable light-transmissive layer may be interposed between the linear polarization layer 2 and the retardation layer 1.

The organic light-emitting element 5 includes a first electrode layer 51 and a second electrode layer 53 which face each other, and an emission layer 52 interposed therebetween.

The first electrode layer 51 may be made of a transparent conductive material, that is, ITO, IZO, In2O3, ZnO and/or the like. The first electrode layer 51 may be patterned using photolithography. In a passive matrix type (PM) organic light-emitting device, patterns of the first electrode layer 51 may be in the form of striped lines which are spaced apart from each other at an interval (that may be predetermined). In an active matrix type (AM) organic light-emitting device, the first electrode layer 51 may be formed to correspond to pixels of the organic light-emitting device. In addition, in the AM organic light-emitting device, a thin film transistor (TFT) layer including at least one TFT may be further formed on the substrate 3 below the first electrode layer 51, and the first electrode layer 51 is electrically connected to the TFT layer. PM organic light-emitting devices and AM organic light-emitting devices will be described in more detail below.

The first electrode layer 51 structured as a transparent electrode can serve as an anode when it is connected to an external terminal.

The second electrode layer 53 is disposed on the first electrode layer 51. The second electrode layer 53 may be a reflective electrode and may be made of aluminum, silver, calcium and/or the like. The second electrode layer 53 can serve as a cathode when it is connected to a second electrode terminal.

In the PM organic light-emitting device, the second electrode layer 53 may be in the form of striped lines perpendicular to the patterns of the first electrode layer 51. In the AM organic light-emitting device, the second electrode layer 53 may be formed to correspond to each pixel, and may be formed over the entire surface of an active area in which images are displayed. A detailed description thereof will be provided below.

The polarity of the first electrode layer 51 may be opposite to that of the second electrode layer 53.

The emission layer 52 interposed between the first electrode layer 51 and the second electrode layer 53 emits light in response to the electrical (e.g., voltage) driving of the first electrode layer 51 and the second electrode layer 53. The emission layer 52 may be made of a low molecular weight organic material or a polymer organic material.

When the emission layer 52 is a low molecular weight organic layer made of a low molecular weight organic material, a hole transport layer and a hole injection layer are stacked on a surface of an organic emission layer (EML) facing the first electrode layer 51, and an electron transport layer and an electron injection layer are stacked on another surface of the organic emission layer facing the second electrode layer 53. In addition to the hole injection layer, the hole transport layer, the electron transport layer, and the electron injection layer, various other suitable layers may be formed when needed.

Examples of the low molecular weight organic material that can be used herein include, but are not limited to, copper phthalocyanine (CuPc), N,N'-di(naphthalene-1-yl)-N,N'-diphenyl-benzidine (NPB), and/or tris-8-hydroxyquinoline aluminum (Alq3).

When the emission layer 52 is a polymer organic layer made of a polymer organic material, only a hole transport layer (HTL) may be formed on a surface of an organic emission layer facing the first electrode layer 51. The polymer hole transport layer may be formed on the first electrode layer 51 by inkjet printing and/or spin-coating using poly-(2,4)-ethylene-dihydroxy thiophene (PEDOT), polyaniline (PANI), and/or the like, and the emission layer 52 may be made of PPV, soluble PPVs, cyano-PPV, polyfluorene, and/or the like.

According to the current embodiment of the present invention, light emitted from the emission layer 52 of the organic light-emitting element 5 is directed towards the substrate 3, and a user views images projected in the bottom direction, i.e., on the bottom side of the substrate 3, as viewed in FIG. 4. That is, the images are projected to the outside below the substrate 3. In bottom emission type structures, external light (e.g., sunlight) may be incident on the structures through the substrate 3, thereby reducing contrast.

However, the current embodiment of the present invention includes the linear polarization layer 2 and the retardation layer 1 that constitute a circular polarizer, thereby minimizing the reflection of external light.

Among external light incident on the bottom side of the substrate 3, light components corresponding to the absorption axis of the linear polarization layer 2 are absorbed in the linear polarization layer 2, and light components corresponding to the transmission axis of the linear polarization layer 2 are transmitted through the linear polarization layer 2. The light components corresponding to the transmission axis of the linear polarization layer 2 are converted to circular polarized light components rotating in one direction while they pass through the retardation layer 1, and are then reflected from the second electrode layer 53 of the organic light-emitting element 5. When they are reflected from the second electrode layer 53, the circular polarized light components rotating in one direction are converted to circular polarized light components rotating in the other direction. While they again pass through the retardation layer 1, the circular polarized light components rotating in the other direction are converted to linearly polarized light components which are perpendicular to the transmission axis of the linear polarization layer 2. Thus, the linearly polarized light components are absorbed into the linear polarization layer 2 along the absorption axis of the linear polarization layer 2, so that they are not emitted from the bottom side of the substrate 3. Therefore, the reflection of external light is minimized, thereby resulting in a relatively high (or better) contrast.

In addition, since the linear polarization layer 2 and the retardation layer 1 are formed on the substrate 3 with no adhesive interposed therebetween, the thickness of the organic light-emitting device can be reduced compared to a conventional organic light-emitting device. Moreover, since there is no adhesive layer, the occurrence of images from an emission layer 52 passing through an adhesive layer, like in conventional organic light-emitting devices, does not occur, thereby resulting in better brightness.

The linear polarization layer 2 may be formed using various suitable film formation methods.

Figure 5:
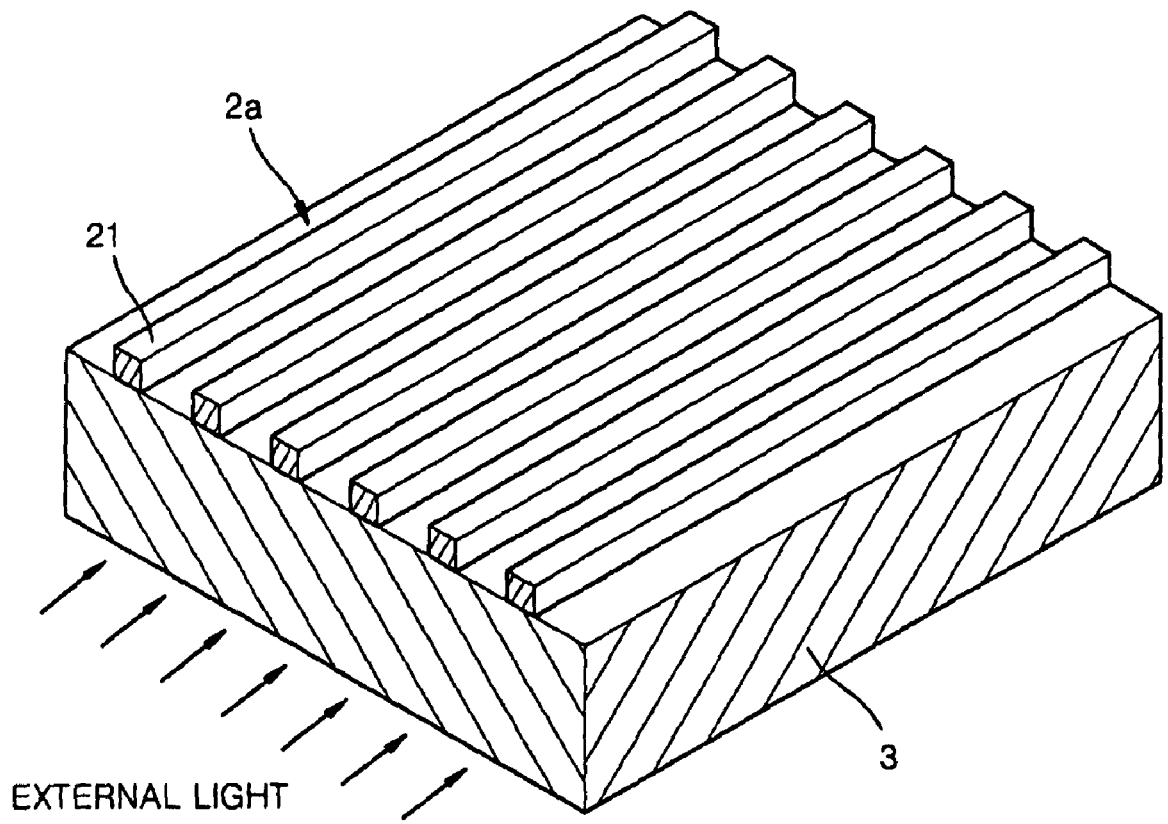
FIGS. 5 and 6 are perspective and cross-sectional views illustrating linear polarization layer according to embodiments of the present invention.

FIG. 5 illustrates an embodiment of a linear polarization layer 2a.

Referring to FIG. 5, the linear polarization layer 2a includes a plurality of wire grids 21 that are disposed on a substrate 3 and are spaced apart from each other at intervals (that may be predetermined). The wire grids 21 may have a width of several tens of nm and a pitch ranging from several tens to several hundreds of nm.

In the current embodiment of the present invention, it is required that the wire grids 21 should have a low reflectivity relative to the incidence direction of external light. Although the reflection of external light can be reduced through circular polarization by a linear polarization layer 2 and the retardation layer 1, light reflection occurring on first planes on which external light is incident, i.e., on surfaces of the wire grids 21 contacting with the substrate 3, as viewed in FIG. 5, are not reduced or prevented by circular polarization.

In this regard, in order to reduce reflectivity on the wire grids 21 relative to the incidence direction of external light, the wire grids 21 may be formed by co-deposition of graphite and metal. Here, the graphite may be normal graphite. CN- and/or CH-graphite obtained by adding nitrogen and/or hydrogen upon deposition may also be used. The metal may be Al, Ag, W, Au, and/or the like.

In order for the wire grids 21 to function as the linear polarization layer 2a, the wire grids 21 must be nano-patterned and have high electroconductivity or higher k (k is the absorption factor among optical constants). The k value of wire grids made of only graphite is merely $\frac{1}{10}$ of the k value of wire grids made of a single metal (e.g., Al). Thus, the wire grids 21 are made of combination of graphite with metal to optimize the k value. The reflectivity of graphite is from about 10 to about 20% of that of aluminum.

The combination of graphite with metal can be achieved by the above-described co-deposition of graphite and metal and/or by doping a metal on a graphite film. Here, in one embodiment, the final content of the metal is adjusted to 5 wt % or less in order to prevent an increase in reflectivity due to the metal.

The above-described metal-containing graphite film can be nano-patterned using a dry etching process wherein a photoresist (PR) process is performed using a $SiO_2$ and/or SiNx hard mask.

Figure 6:
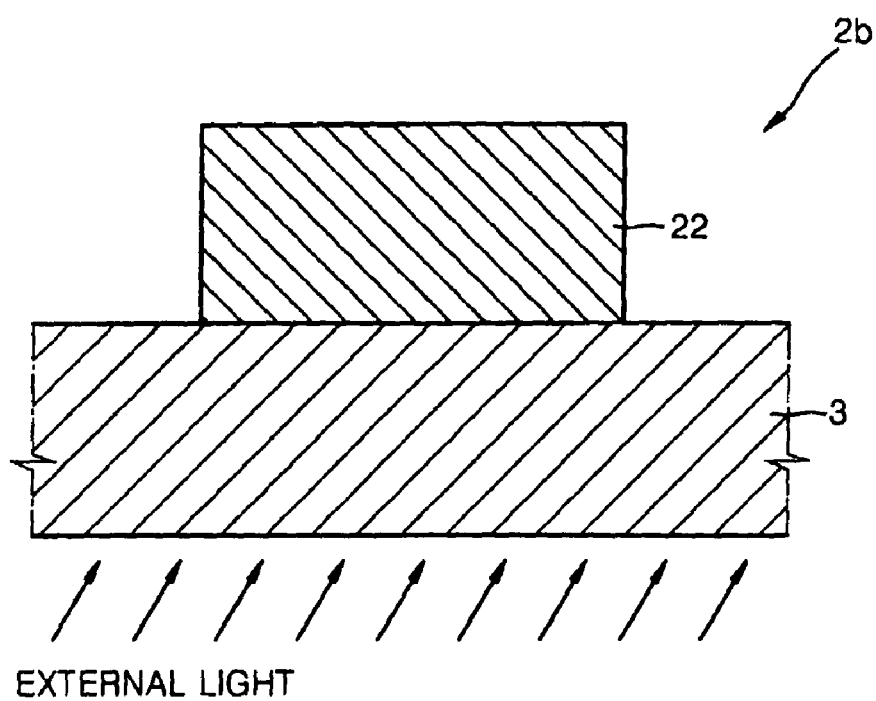

FIG. 6 is a view illustrating a linear polarization layer 2b according to another embodiment of the present invention.

Figure 7:
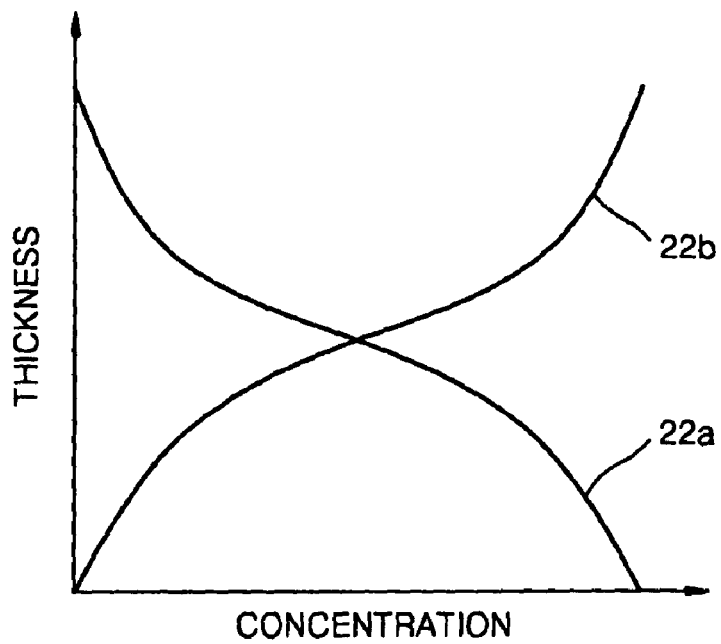
FIG. 7 is a graph illustrating component contents of a wire grid of the linear polarization layer of FIG. 6.

Referring to FIG. 6, a wire grid 22 is composed of a first component 22a, which is a transparent material, and a second component 22b, which is a metal. The first component 22a and the second component 22b have a concentration gradient in a thickness direction of the wire grid 22 (e.g., a direction perpendicular to a surface of a substrate 3 that the wire grid 22 is disposed on). In more detail, the content of the first component 22a increases toward the substrate 3, and the content of the second component 22b increases away from the substrate 3 (i.e., near the substrate 3 there is a higher concentration of the first component 22a and away from the substrate 3 there is a higher concentration of the second component). That is, as illustrated in FIG. 7, in order to form the wire grid 22 on the substrate 3, the first component 22a and the second component 22b may be deposited so that the concentration gradient of the first component 22a is opposite to that of the second component 22b. The proportion of the first component 22a relative to the second component 22b increases as the thickness of the wire grid 22 decreases, and the proportion of the second component 22b relative to the first component 22a increases as the thickness of the wire grid 22 increases. Thus, the content of the first component 22a is predominant in a region of the wire grid 22 which is located near the substrate 3, and the content of the second component 22b is predominant in a region of the wire grid 22 which is located away from the substrate 3.

The first component 22a may be at least one transparent material selected from the group consisting of transparent and insulating materials such as $SiO_x$ ($x \geq 1$), $SiN_x$ ($x \geq 1$), $MgF_2$, $CaF_2$, $Al_2O_3$, and $SnO_2$, transparent and conductive materials such as ITO, IZO, ZnO, and $In_2O_3$, and combinations thereof.

The second component 22b may be at least one material selected from the group consisting of Fe, Co, V, Ti, Al, Ag, Si, Cr, Mo, Ge, Y, Zn, Zr, W, Ta, Cu, Pt, and combinations thereof.

As the thickness of the wire grid 22 made of a mixture of a metal and a transparent material having concentration gradients increases, the ratio of the opaque metal to the transparent material increases, thereby leading to a refractive index difference and thus reducing or preventing interfacial reflection. Thus, an effect of absorption of incident light into the wire grid 22 is achieved.

Figure 8:
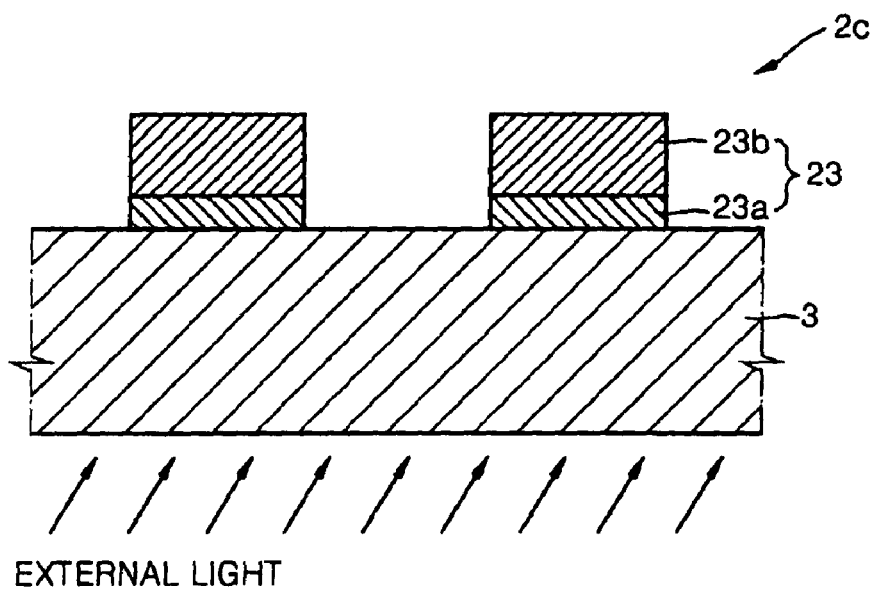
FIGS. 8 and 9 are cross-sectional views illustrating linear polarization layer according to embodiments of the present invention.

FIG. 8 is a view illustrating a linear polarization layer 2c according to another embodiment of the present invention.

Referring to FIG. 8, a low reflective layer 23a is disposed to be close to the incidence side of external light, i.e., adjacent to a substrate 3, and a metal layer 23b is disposed on the low reflective layer 23a. By doing so, the reflection of incident light on a surface of a wire grid 23, i.e., on a surface of the wire grid 23 adjacent to the substrate 3 can be dramatically reduced. The low reflective layer 23a may be made of CdSe, CdTe, ruthenium, and/or the like.

Figure 9:
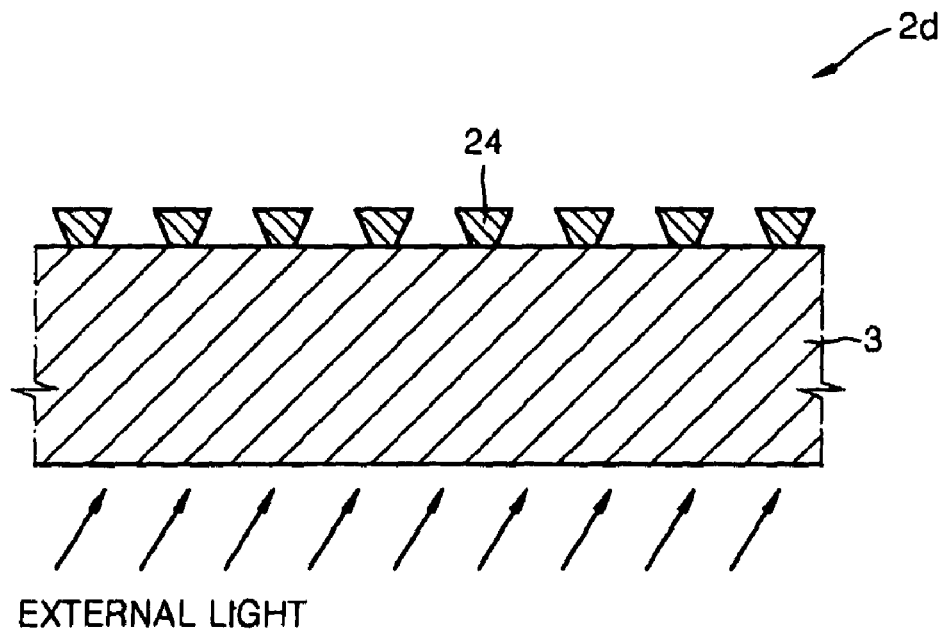

FIG. 9 is a view illustrating a linear polarization layer 2d according to another embodiment of the present invention.

Referring to FIG. 9, wire grids 24 having an overhang structure are disposed on a substrate 3. The wire grids 24 may be made of a metal such as Al, Au, Ag, and/or W. The wire grids 24 may be formed by forming a PR pattern having openings, depositing a metal in the openings, and lifting-off the PR pattern.

The wire grids 24 thus formed are surface-blackened using a chemical method.

In one embodiment, when the wire grids 24 are made of aluminum, they are treated with acid to remove a surface oxide layer and then surface-blackened with a solution of 5 ml of nitric acid, 25 g of copper nitrate, and 10 g of potassium permanganate in 1 L of water.

Such wire grids 24 can reduce (or minimize) the reflection of external light.

The retardation layer 1 (See FIG. 1) is formed on the linear polarization layer 2 having reduced (or minimized) reflectivity of external light as illustrated in FIG. 1.

According to the current embodiment of the present invention, the retardation layer 1 may be made of CaO and/or BaO, and thus the retardation layer 1 can also be used for moisture-absorbing.

The linear polarization layer 2 and the retardation layer 1 may be formed using various suitable methods. In addition, the linear polarization layer 2 and the retardation layer 1 can be used in all suitable embodiments of the present invention and a number of which will be described hereinafter in more detail. Various embodiments illustrated in FIGS. 5 through 9 are based on the bottom emission type organic light-emitting device illustrated in FIG. 4, but can be suitably changed and applied to top emission type organic light-emitting devices according to an emit direction of external light.

Figure 10:
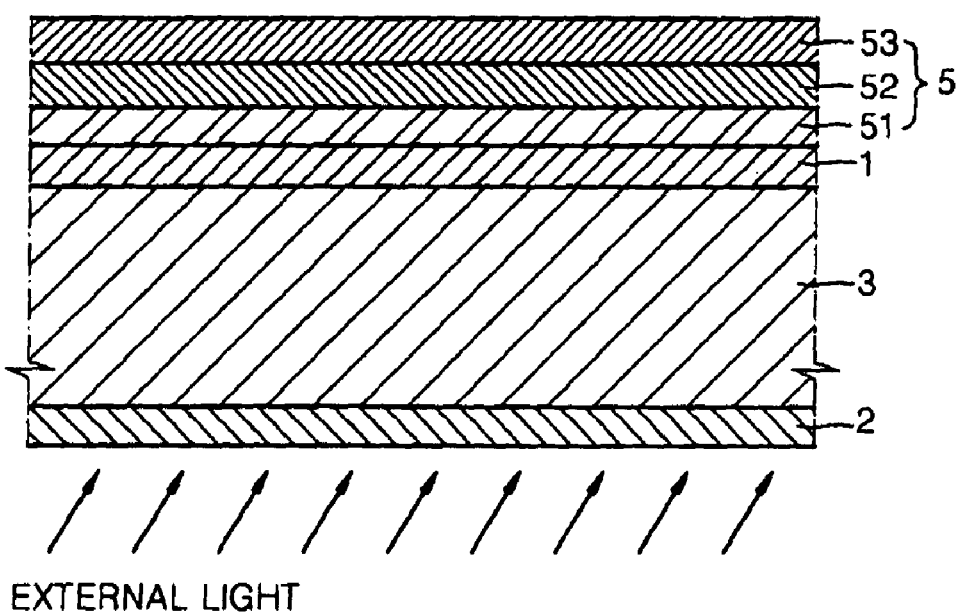
FIGS. 10 and 11 are cross-sectional views illustrating bottom emission type organic light-emitting devices according to embodiments of the present invention.

FIG. 10 is a cross-sectional view illustrating a bottom emission type organic light-emitting device according to another embodiment of the present invention. Referring to FIG. 10, a linear polarization layer 2 is formed on a surface of a substrate 3 facing the outside, and a retardation layer 1 is formed on the other surface of the substrate 3. An organic light-emitting element 5 is disposed on the retardation layer 1. These constitutional elements are substantially the same as the elements as described above. According to the current embodiment of the present invention, as described above, external light incident on the substrate 3 is converted to linearly polarized light which is parallel to the transmission axis of the linear polarization layer 2 while it passes through the linear polarization layer 2. The linearly polarized light is transmitted through the substrate 3 and then converted to circular polarized light rotating in one direction while it passes through the retardation layer 1. The circular polarized light rotating in one direction is reflected from a second electrode layer 53 and then converted to circular polarized light rotating in the other direction. While it again passes through the retardation layer 1, the circular polarized light rotating in the other direction is converted to linearly polarized light which is perpendicular to the transmission axis of the linear polarization layer 2. The linearly polarized light cannot pass through the linear polarization layer 2, and thus, the external light reflected cannot be emitted (or can be blocked from being emitted) to the outside from a bottom side of the substrate 3.

Figure 11:
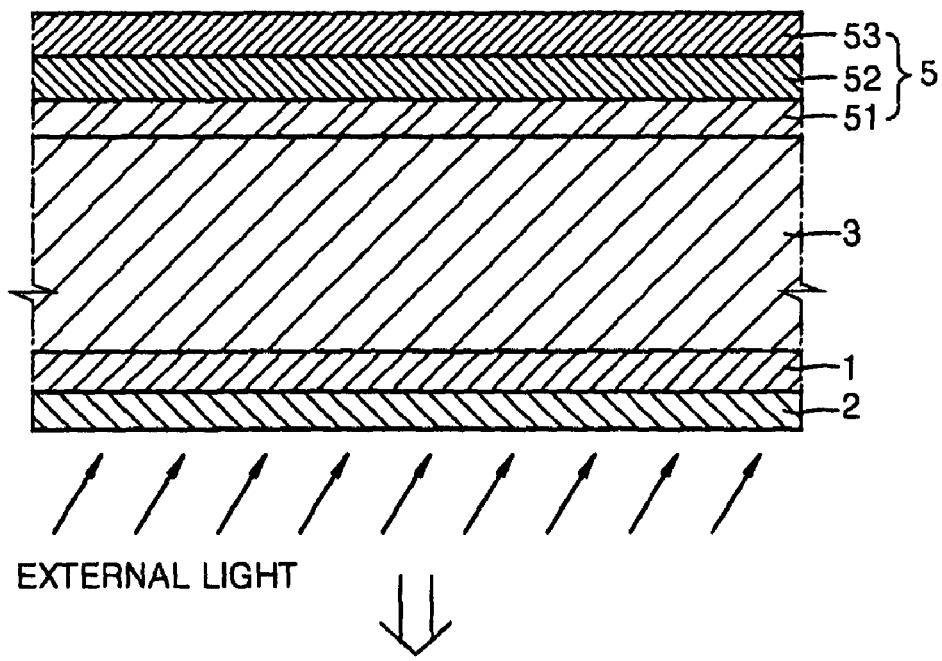

FIG. 11 is a cross-sectional view illustrating a bottom emission type organic light-emitting device, according to another embodiment of the present invention. Referring to FIG. 11, a retardation layer 1 and a linear polarization layer 2 are sequentially formed on a surface of a substrate 3 facing the outside, and an organic light-emitting element 5 is disposed on the other surface of the substrate 3. These constitutional elements are as described above. According to the current embodiment of the present invention, as described above, the reflection of external light is reduced (or prevented), thereby improving contrast.

According to the above-described embodiments of the present invention, it is possible to solve the disadvantage of conventional organic light-emitting device structures that suffer from a thickness increase due to attachment of a separate polarization film using an adhesive.

The above embodiments of the present invention have been described in terms of bottom emission type organic light-emitting devices displaying images in (or toward) the direction of a substrate (or toward the substrate), but the present invention is not limited thereto. The present invention can also be applied to top emission type organic light-emitting devices displaying images coming from an emission layer and toward an opposite direction to a substrate.

Figure 12:
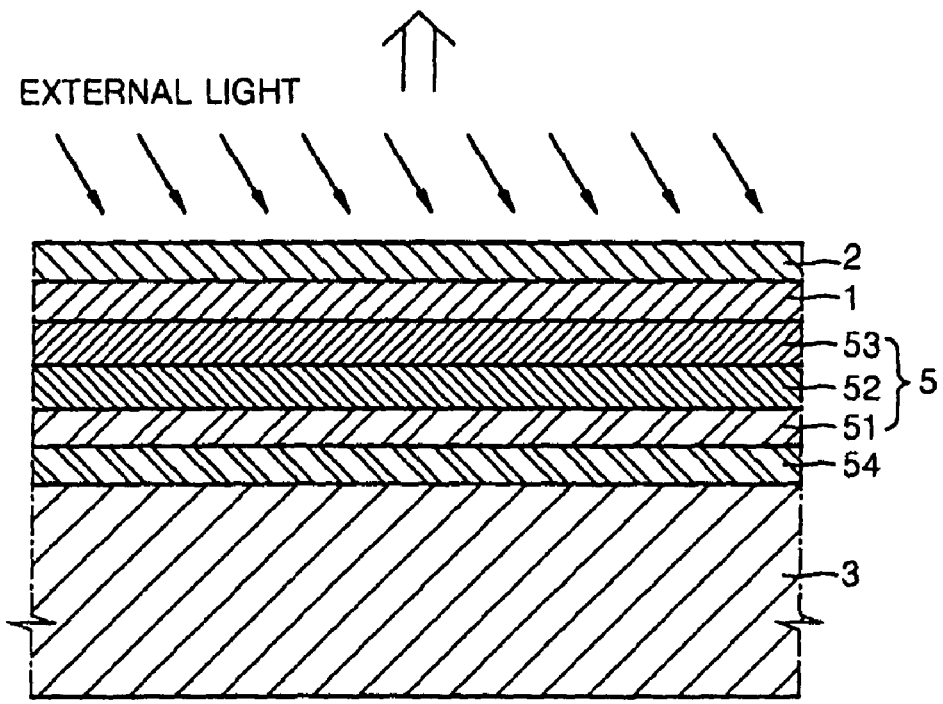
FIGS. 12, 13, 14, 15, 16, 17, and 18 are schematic cross-sectional views illustrating top emission type organic light-emitting device according to embodiments of the present invention.

FIG. 12 is a cross-sectional view illustrating a top emission type organic light-emitting device, according to another embodiment of the present invention. Referring to FIG. 12, a reflective layer 54 is disposed on a substrate 3, and an organic light-emitting element 5 is disposed on the reflective layer 54. A sealing member for sealing the organic light-emitting element 5 is disposed on the organic light-emitting element 5.

The substrate 3 may be a transparent glass substrate as described above, but does not necessarily have to be transparent. The substrate 3 may be made of a plastic material and/or a metal material, in addition to glass. When the substrate 3 is made of a metal, an insulating film may be disposed on a surface of the metal.

The reflective layer 54 disposed on a surface of the substrate 3 may be made of Ag, Mg, Al, Pt, Pd, Au, Ni, Nd, Ir, Cr, or compounds thereof. A first electrode layer 51 may be formed on the reflective layer 54 using a material with a high work function, e.g., ITO, IZO, ZnO, and/or $In_2O_3$. In this case, the first electrode layer 51 serves as an anode. If the first electrode layer 51 is used as a cathode, the first electrode layer 51 may be made of Ag, Mg, Al, Pt, Pd, Au, Ni, Nd, Ir, Cr, or compounds thereof so that the first electrode layer 51 can also serve as a reflective layer. Hereinafter, embodiments of the present invention will be described in terms of the use of the first electrode layer 51 as an anode.

A second electrode layer 53 may be formed as a transmissive electrode. Thus, the second electrode layer 53 may be formed as a translucent film with a thin thickness using a metal with a low work function, e.g., Li, Ca, LiF/Ca, LiF/Al, Al, Mg, and/or Ag. When a transparent and conductive structure made of ITO, IZO, ZnO, and/or $In_2O_3$ is formed on such a metal translucent film, a high resistance problem due to the thinness of the translucent film can be overcome.

An emission layer 52 is interposed between the first electrode layer 51 and the second electrode layer 53 and is as described above.

In the current embodiment of the present invention, a retardation layer 1 and a linear polarization layer 2 are sequentially formed on the second electrode layer 53.

Thus, external light incident on an image display surface, i.e., external light coming from an upper side (as viewed in FIG. 12), passes through the linear polarization layer 2 and the retardation layer 1 in sequence. The incident light, after being reflected from each layer of the organic light-emitting element 5 or the reflective layer 54, cannot pass through the retardation layer 1. The principle is as described above, and thus, a detailed description thereof will not be provided again.

Figure 13:
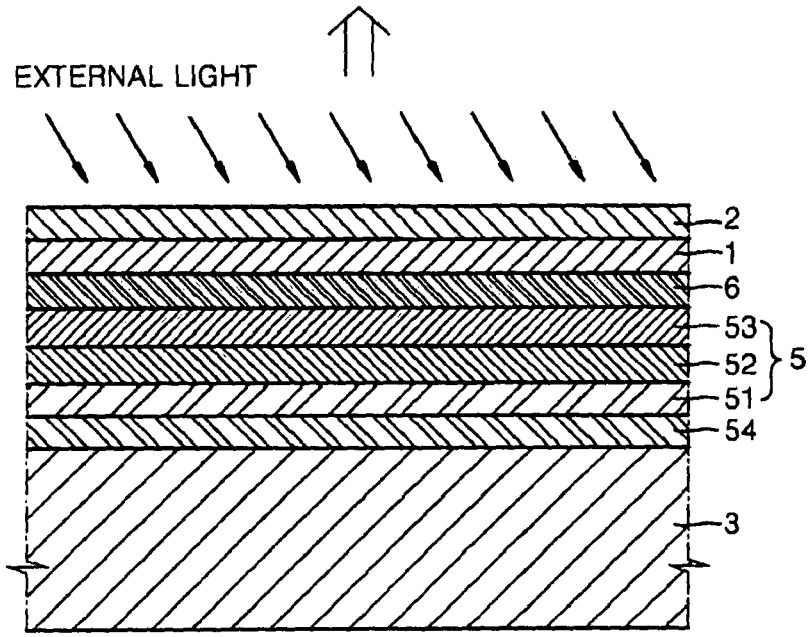

Referring to FIG. 13, a protective layer 6 may be formed on the second electrode layer 53. Then, the retardation layer 1 and the linear polarization layer 2 may be formed on the protective layer 6.

The protective layer 6 may made of transparent inorganic material and/or organic material so that the second electrode layer 53 may not be damaged while the retardation layer 1 is being formed.

The inorganic material may be metal oxide, metal nitride, metal carbide, metal oxynitride, or compounds thereof. The metal oxide may be silicon oxide, aluminum oxide, titanium oxide, indium oxide, tin oxide, indium tin oxide, or compounds thereof. The metal nitride may be aluminum nitride, silicon nitride, or compounds thereof. The metal carbide may be silicon carbide, and the metal oxynitride may be silicon oxynitride. The inorganic material may be silicon, and may be ceramic derivatives of each of silicon and metal. In addition, the inorganic material may be diamond-like carbon (DLC) and/or the like.

The organic material may be an organic polymer, an inorganic polymer, an organometallic polymer, a hybrid organic/inorganic polymer, acryl resin and/or the like.

Although not illustrated in FIG. 13, the protective layer 6 may be interposed between the retardation layer 1 and the linear polarization layer 2, or alternatively, may be formed on the linear polarization layer 2.

Figure 14:
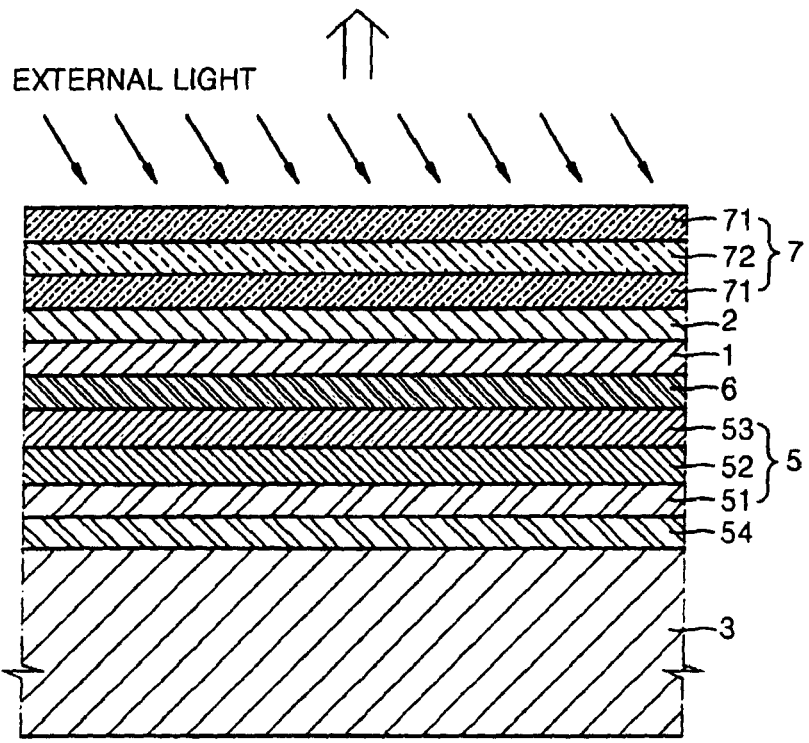

FIG. 14 is a cross-sectional view illustrating a top emission type organic light-emitting device, according to another embodiment of the present invention. Referring to FIG. 14, a thin film type sealing member 7 is further formed on the linear polarization layer 2 in the embodiment of the present invention illustrated in FIG. 13.

The thin film type sealing member 7 protects the organic light-emitting element 5 from the external moisture and air and/or the like. The thin film type sealing member 7 includes at least one of an inorganic layer 71 or an organic layer 72, and may be formed by alternately stacking the inorganic layer 71 and the organic layer 72. Other structures are substantially the same as described above, and thus detailed descriptions will be provided again.

The inorganic layer 71 may be made of metal oxide, metal nitride, metal carbide, metal oxynitride, or compounds thereof. The metal oxide may be silicon oxide, aluminum oxide, titanium oxide, indium oxide, tin oxide, indium tin oxide, or compounds thereof. The metal nitride may be aluminum nitride, silicon nitride, or compounds thereof. The metal carbide may be silicon carbide. The metal oxynitride may be silicon oxynitride. The inorganic material may be silicon, and may be ceramic derivatives of silicon and metal. In addition, the inorganic material may be DLC and/or the like.

The inorganic layer 71 may be formed by a deposition process. When the inorganic layer 71 is formed by the deposition process, fine pores formed in the inorganic layer 71 may be enlarged (or grown). Accordingly, in order to prevent the pores from being continually enlarged (or grown) at the same position, an organic layer 72 is further formed in addition to the inorganic layer 71. The organic layer 72 may be made of an organic polymer, an inorganic polymer, an organometallic polymer, a hybrid organic/inorganic polymer, and/or the like, and, in one embodiment, is made of an acryl resin.

According to the current embodiment of the present invention, the inorganic layer 71, the organic layer 72, and the inorganic layer 71 are sequentially formed on the linear polarization layer 2, but the present invention is not limited thereto. That is, the organic layer 72, the inorganic layer 71, and the organic layer 72 may be sequentially formed, or alternately, at least one of the organic layer 72, the inorganic layer 71, or the organic layer 72 may be a plurality of layers. The thin film type sealing member 7 is not necessarily used in an embodiment of the present invention, and may be used in all suitable embodiments of the present invention.

Figure 15:
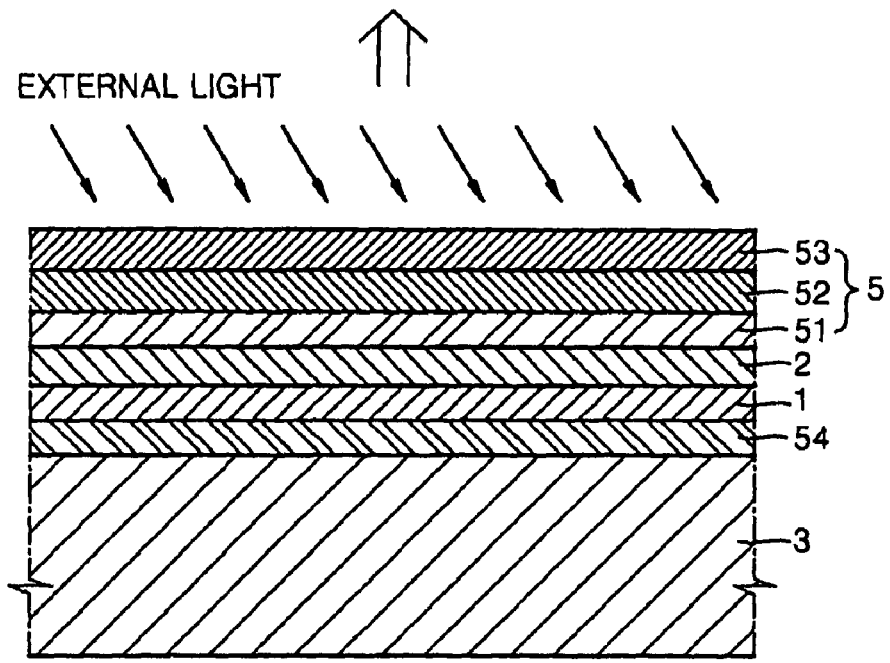

FIG. 15 is a cross-sectional view illustrating a top emission type organic light-emitting device, according to another embodiment of the present invention. Referring to FIG. 15, a retardation layer 1 and a linear polarization layer 2 are formed between a reflective layer 54 and an organic light-emitting element 5. Here, while an external light incident from the outside of an arrow direction is passing through the linear polarization layer 2, the external light becomes a linearly polarized light parallel to a transmission axis. While the external light is passing through the retardation layer 1, the external light becomes one direction rotary circular polarized light. The external light is reflected on the reflective layer 54, and becomes the other direction rotary circular polarized light. While the other direction rotary circular polarized light is re-passing through the retardation layer 1, the other direction rotary circular polarized light becomes a linearly polarized light perpendicular to the transmission axis. The linearly polarized light does not pass through the linear polarization layer 2. Thus reflected external light cannot be seen from the outside below the substrate 3.

Also, in FIG. 15, the retardation layer 1 may be formed on the reflective layer 54, the organic light-emitting element 5 may be formed on the retardation layer 1, and the linear polarization layer 2 may be formed on the organic light-emitting element 5.

Figure 16:
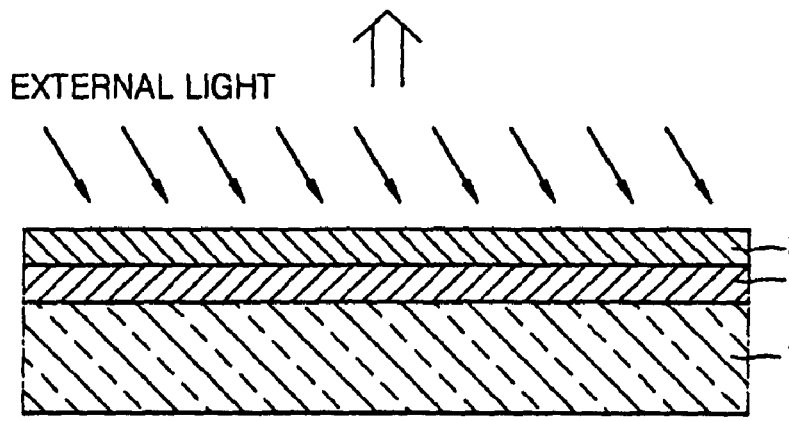
Figure 16:
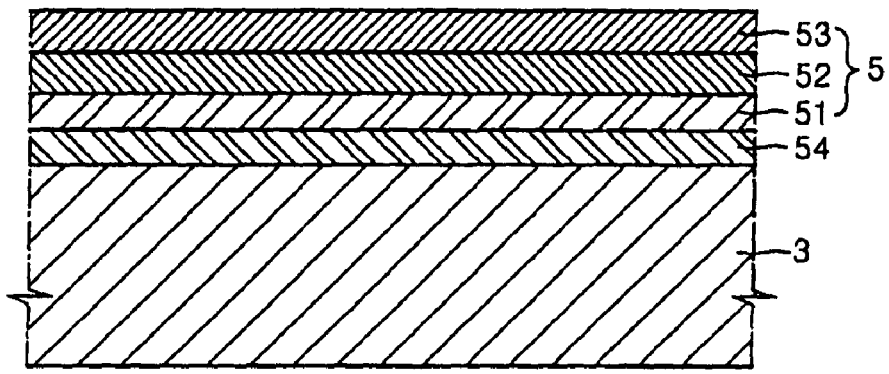

FIG. 16 is a cross-sectional view illustrating an organic light-emitting device where a transparent substrate is used as a sealing member 7, according to an embodiment of the present invention.

The transparent substrate may be a glass substrate, but is not limited thereto. That is, the transparent substrate may be a plastic substrate.

A retardation layer 1 and a linear polarization layer 2 are sequentially formed on a surface of the sealing member 7, that is, a surface towards the outside of the organic light-emitting device.

Figure 17:
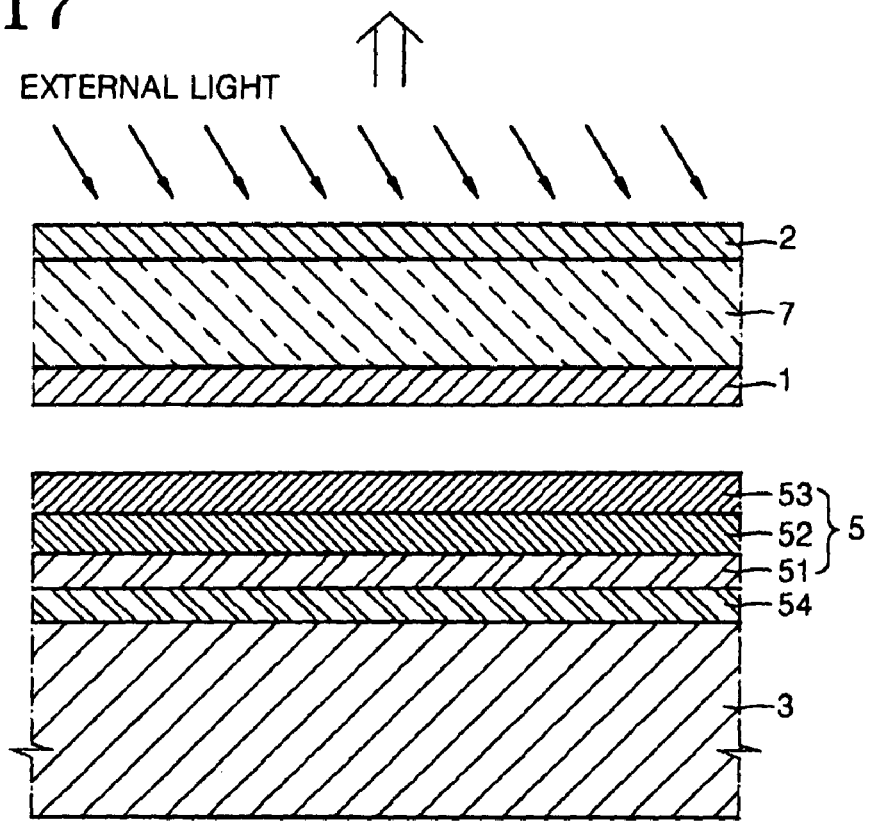

FIG. 17 is a cross-sectional view illustrating an organic light-emitting device where a transparent substrate is used as a sealing member 7 according to another embodiment of the present invention.

Figure 18:
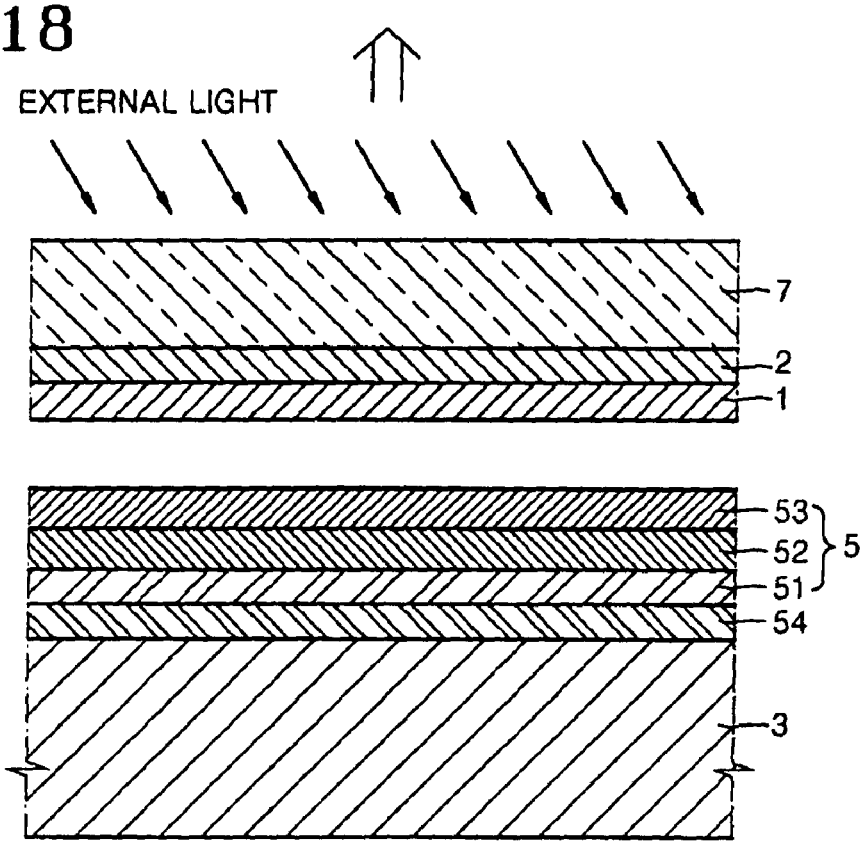

In more detail, FIG. 17 illustrates a top emission type organic light-emitting device according to another embodiment of the present invention, a retardation layer 1 is formed on a surface of a transparent substrate used as a sealing member 7 facing an organic light-emitting element 5, and a linear polarization layer 2 is formed on the other surface of the sealing member 7. FIG. 18 illustrates that a linear polarization layer 2 and a retardation layer 1 are sequentially formed on a surface of a transparent substrate used as a sealing member 7 facing an organic light-emitting element 5.

According to the current embodiments of the present invention, a side of a linear polarization layer is disposed to face external light and a retardation layer is disposed on an opposite side of the linear polarization layer that is opposite to the side of the linear polarization layer facing the external light, and thus, the reflection of external light can be reduced (or prevented) according to the same principle as described above.

In the embodiments illustrated in FIGS. 16 through 18, an inert gas may also be filled between a sealing member and an organic light-emitting element, and an organic or inorganic material can be further deposited to improve the sealing characteristics of the organic light-emitting element.

Figure 19:
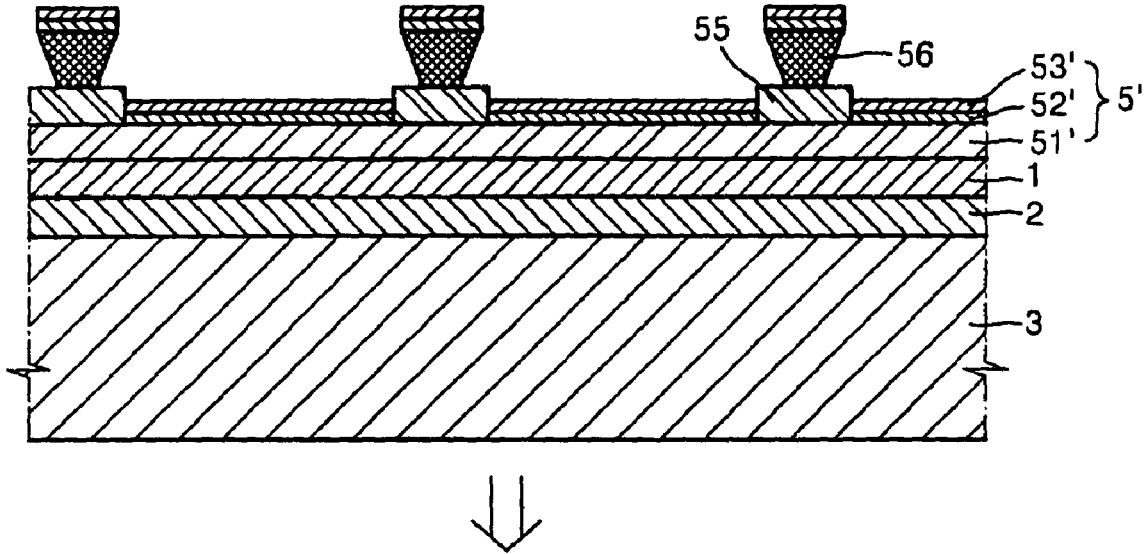
FIGS. 19 and 20 are cross-sectional views illustrating passive matrix type (PM) bottom emission type organic light-emitting device according to embodiments of the present invention.
Figure 19:

FIG. 19 is a cross-sectional view illustrating a passive matrix type (PM) bottom emission type organic light-emitting device according to an embodiment of the present invention in more detail.

Referring to FIG. 19, a linear polarization layer 2 and a retardation layer 1 (e.g., as illustrated in FIG. 1) are sequentially formed on a substrate 3, and an organic light-emitting element 5' is disposed on the retardation layer 1.

A first electrode layer 51' is formed in a stripe pattern on the retardation layer 1, and an internal insulating film 55 is disposed on the first electrode layer 51' to partition the first electrode layer 51'. A separator 56 perpendicular to the first electrode layer 51' is disposed on the internal insulating film 55 to pattern an emission layer 52' and a second electrode layer 53'. The emission layer 52' and the second electrode layer 53' are patterned by the separator 56 so that they cross (or intersect) with the first electrode layer 51'. A sealing member is disposed on the second electrode layer 53' to protect the organic light-emitting element 5' from ambient (or external or outside) air. In some cases, the emission layer 52' and the second electrode layer 53' may also be patterned with no separator.

According to the embodiment illustrated in FIG. 19, like the embodiment illustrated in FIG. 4, external light incident on a bottom side of a substrate is not reflected, thereby improving contrast, and the entire thickness of a display device can be decreased.

In addition, the structures illustrated in FIGS. 10 and 11 can also be applied to the PM organic light-emitting device.

Figure 20:
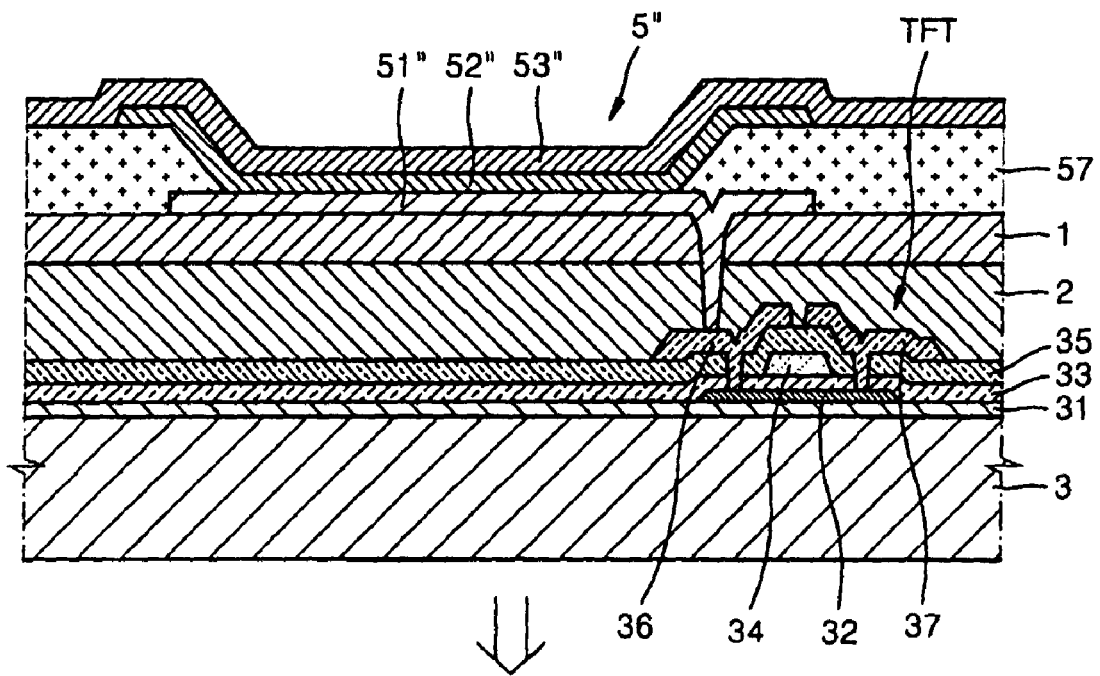

FIG. 20 is a cross-sectional view illustrating an active matrix type (AM) bottom emission type organic light-emitting device, according to another embodiment of the present invention.

Referring to FIG. 20, a thin film transistor is formed on a substrate 3. At least one TFT is formed for every pixel, and is electrically connected to an organic light-emitting element 5".

In more detail, a buffer layer 31 is disposed on the substrate 3, and a semiconductor active layer 32 is formed in a pattern (that may be predetermined) on the buffer layer 31. A gate insulating film 33 made of $SiO_2$, SiNx, or the like is disposed on the semiconductor active layer 32, and a gate electrode 34 is disposed on a portion of the gate insulating film 33. The gate electrode 34 is connected to a gate line for applying a TFT ON/OFF signal. An inter-insulating layer 35 is disposed on the gate electrode 34, and a source/drain electrode 36 is contacted to a source/drain region of the semiconductor active layer 32 through a contact hole.

The TFT thus formed is covered and protected with a passivation layer. According to the embodiment illustrated in FIG. 20, the passivation layer is structured as a linear polarization layer 2 and a retardation layer 1 that are sequentially stacked.

A first electrode layer 51", which is used as an anode, is disposed on the retardation layer 1 and is covered with a pixel define layer 57 made of an insulating material. An opening is formed in the pixel define layer 57, and an emission layer 52" is formed in a region defined by the opening. A second electrode layer 53" is formed on the emission layer 52" so that all pixels are covered with the second electrode layer 53".

In the above-described AM-type structure, the linear polarization layer 2 and the retardation layer 1 which are sequentially disposed on the TFT can reduce (or prevent) the reflection of external light incident on the bottom side of the substrate 3 (as viewed in FIG. 20).

Figure 21:
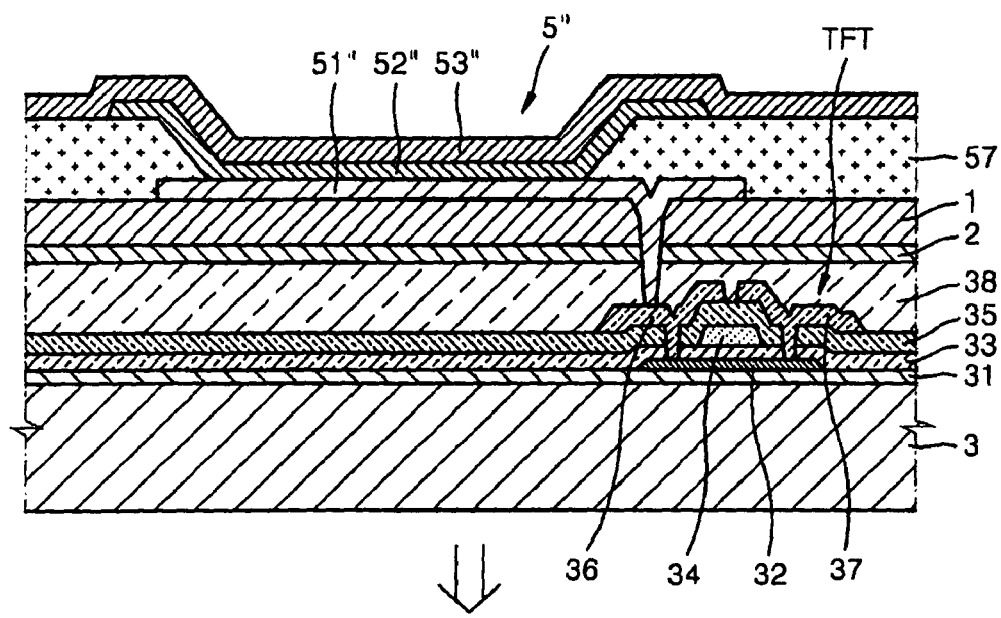
FIG. 21 is a cross-sectional view illustrating an active matrix type (AM) bottom emission type organic light-emitting device according to another embodiment of the present invention.
Figure 21:

Referring to FIG. 21, a passivation layer 38 is separately formed on a TFT using an organic material and/or an inorganic material, and a linear polarization layer 2 and a retardation layer 1 are sequentially formed on the passivation layer 38.

In such bottom emission type AM organic light-emitting devices, provided that a linear polarization layer is disposed to face external light and a retardation layer is disposed to face an organic light-emitting element, the linear polarization layer and the retardation layer may be formed on any suitable surface of a substrate, a TFT, or an organic light-emitting element. That is, as illustrated in FIGS. 4, 10 and 11, the retardation layer (e.g., layer 1) and/or the linear polarization layer (e.g., layer 2) may be disposed on one surface of a substrate and/or the other surface of the substrate opposite to the one surface, and a TFT and an organic light-emitting element may be disposed on the ¼ wavelength layer and/or the linear polarization layer. In addition, the retardation layer and/or the linear polarization layer may also be interposed at an interface(s) between layers constituting a TFT.

Figure 22:
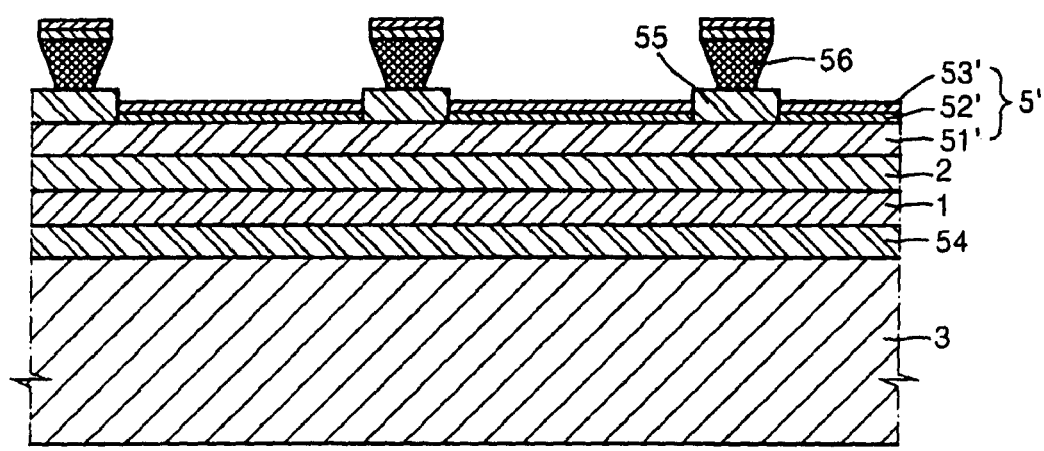
FIG. 22 is a cross-sectional view illustrating a PM top emission type organic light-emitting device, according to anther embodiment of the present invention.

FIG. 22 is a cross-sectional view illustrating a PM top emission type organic light-emitting device according to another embodiment of the present invention in more detail.

Referring to FIG. 22, a reflective layer 54 is formed on a substrate 3, and a linear polarization layer 2 and a retardation layer 1 are sequentially formed on the reflective layer 54. An organic light-emitting element 5' is formed on the linear polarization layer 2.

A first electrode layer 51' is formed on the retardation layer 1 in stripe type lines (that may be predetermined). An internal insulating film 55 is formed on the first electrode layer 51' to divide the first electrode layer 51'. A separator 56 for patterning an emission layer 52' and a second electrode layer 53' is formed on the internal insulating film 55 so as to be perpendicular to the first electrode layer 51'. The emission layer 52' and the second electrode layer 53' are pattered patterned by the separator 56 so as to cross (or intersect) the first electrode layer 51'. A sealing member is formed on the second electrode layer 53' to seal the organic light-emitting element 5' from the outside. If necessary, the emission layer 52' and the second electrode layer 53' can be patterned without the separator 56.

According to the current embodiment of the present invention, reflection of external light can be reduced (or prevented) to improve contrast, and the entire thickness of the organic light-emitting device can be reduced.

In addition, the above structures of FIGS. 12 through 14, and 16 through 18 can be used in such PM organic light-emitting device.

Figure 23:
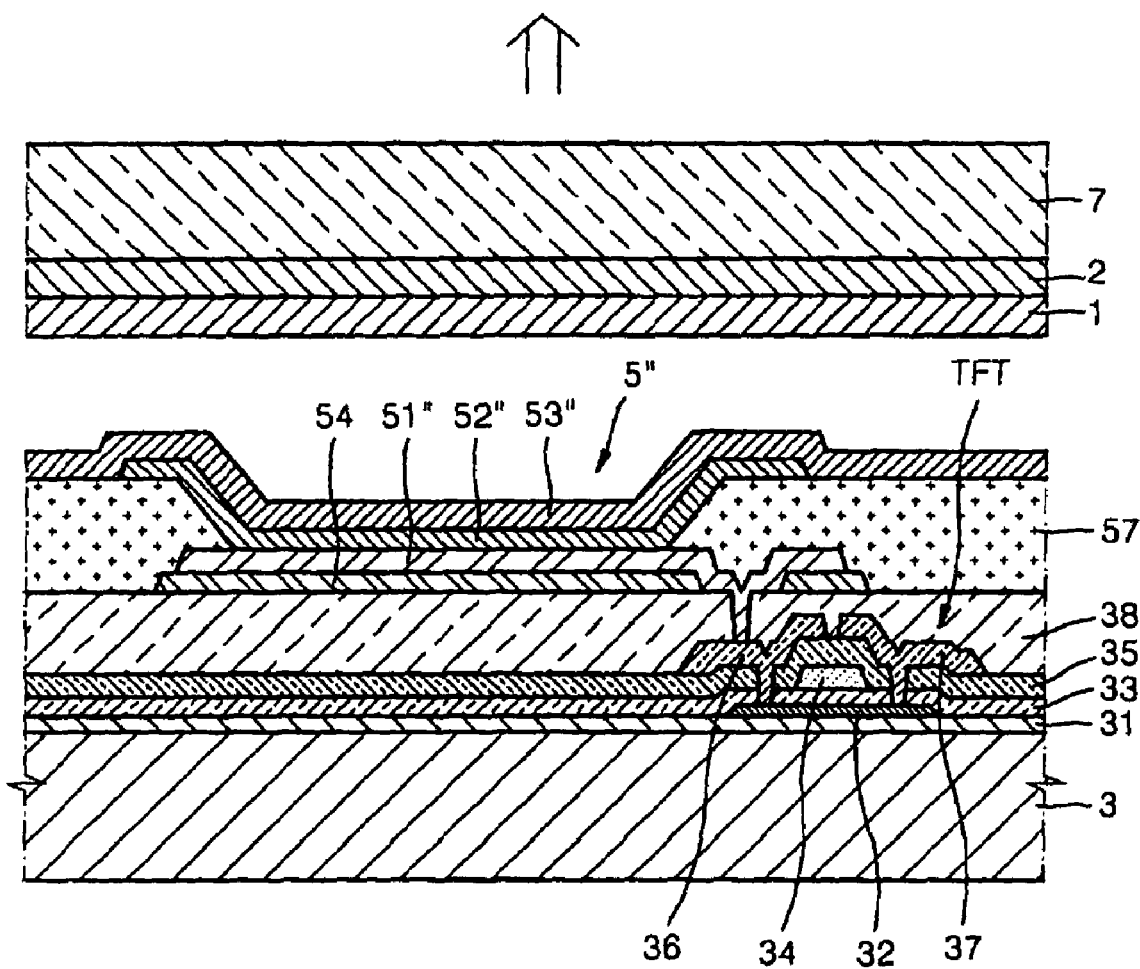
FIG. 23 is a cross-sectional view illustrating an AM top emission type organic light-emitting device, according to another embodiment of the present invention.

FIG. 23 is a cross-sectional view illustrating an AM top emission type organic light-emitting device, according to another embodiment of the present invention.

Referring to FIG. 23, a TFT is formed on a substrate 3. At least one TFT is formed for every pixel, and is electrically connected to an organic light-emitting element 5". The structure of the TFT is substantially the same as described in FIG. 20, and thus detailed descriptions will not be provided again.

A passivation layer 38 covers the TFT, and a reflective layer 54 is formed on the passivation layer 38. A first electrode layer 51" constituting an anode is formed on the reflective layer 54, and a pixel define layer 57 made of an insulating material covers the first electrode layer 51". An opening is formed in the pixel define layer 57, and an emission layer 52" is formed in an area defined by the opening. A second electrode layer 53" is formed so as to cover all pixels.

According to the current embodiment of the present invention, the linear polarization layer 2 and the retardation layer 1 are sequentially formed on a surface of a substrate which is the sealing member 7 facing the linear polarization layer 2 like the embodiment of the present invention illustrated in FIG. 18. Accordingly, reflection of external light incident from the part above the sealing member 7 can be reduced (or prevented) due to the linear polarization layer 2 and the retardation layer 1.

Also, the structures of FIGS. 12 through 17 can be used in such AM organic light-emitting device.

According to embodiments of the above-described light-emitting devices of the present invention, a retardation layer (or film) can be simply formed using a method of forming layers, and can concurrently be used for moisture-absorbing. Also, a circular polarization layer can be formed using a film formation process, thereby reducing (or preventing) the reflection of external light, resulting in better contrast. Moreover, an adhesive for attaching a circular polarization layer is not used, thereby decreasing the thickness of a display device and limiting (or preventing) a reduction in brightness.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting device comprising:
    a substrate;
    an organic light-emitting element disposed on the substrate and for displaying an image;
    a sealing member disposed on the organic light-emitting element;
    a retardation layer disposed on a first surface of the substrate, the organic light-emitting element, or the sealing member, and comprising an alkali oxide layer grown up to be inclined on the first surface; and
    a linear polarization layer disposed on a second surface of the substrate, the organic light-emitting element, the sealing member, or the retardation layer, and being disposed closer to an image display surface of the organic light-emitting device than the retardation layer.

2. The organic light-emitting device of claim 1, wherein the linear polarization layer is disposed on the substrate, the retardation layer is disposed on the linear polarization layer, and the organic light-emitting element is disposed on the retardation layer.

3. The organic light-emitting device of claim 1, wherein the retardation layer is disposed on the substrate, the organic light-emitting element is disposed on the retardation layer, and the linear polarization layer is disposed on the substrate opposite to a surface of the substrate facing the retardation layer.

4. The organic light-emitting device of claim 1, wherein the retardation layer and the linear polarization layer are sequentially disposed on the substrate opposite to a surface of the substrate facing the organic light-emitting element.

5. The organic light-emitting device of claim 1, wherein the retardation layer is disposed on the organic light-emitting element, and the linear polarization layer is disposed on the retardation layer.

6. The organic light-emitting device of claim 1, further comprising:
    a protective layer disposed on the organic light-emitting element,
    wherein the retardation layer is disposed on the protective layer, and the linear polarization layer is disposed on the retardation layer.

7. The organic light-emitting device of claim 1, further comprising:
    a protective layer disposed on the organic light-emitting element,
    wherein the retardation layer is disposed between the organic light-emitting element and the protective layer, and the linear polarization layer is disposed on the protective layer.

8. The organic light-emitting device of claim 1, further comprising:
    a reflective layer interposed between the substrate and the organic light emitting layer,
    wherein the retardation layer is disposed between the reflective layer and the organic light-emitting element, and the linear polarization layer is disposed on the organic light-emitting element.

9. The organic light-emitting device of claim 1, wherein the sealing member is a transparent substrate, and the retardation layer and the linear polarization layer are sequentially disposed on the sealing member opposite to a surface of the sealing member facing the organic light-emitting element.

10. The organic light-emitting device of claim 1, wherein the sealing member is a transparent substrate, and the retardation layer is disposed on the first surface of the sealing member facing the organic light-emitting element, and the linear polarization layer is disposed on the second surface of the sealing member opposite to the first surface of the sealing member facing the retardation layer.

11. The organic light-emitting device of claim 1, wherein the sealing member is a transparent substrate, wherein the linear polarization layer is disposed on the second surface of the sealing member facing the organic light-emitting element, and the retardation layer is disposed on the first surface of the linear polarization layer facing the organic light-emitting element.

12. The organic light-emitting device of claim 1, wherein the alkali oxide comprises CaO, BaO, or combinations thereof.

13. The organic light-emitting device of claim 1, wherein the retardation layer comprises a quarter (¼) wavelength layer, a half (½) wavelength layer, or combinations thereof.

* * * * *